United States Patent [19]

Haidinger

[11] 4,341,013
[45] Jul. 27, 1982

[54] METHOD FOR ATTACHING AND SECURING POWER SUPPLY WIRES TO ELECTRICAL COMPONENTS

[75] Inventor: Erich Haidinger, Deutschlandsberg, Austria

[73] Assignee: Siemens Aktiengesellschaft, Berlin and Munich, Fed. Rep. of Germany

[21] Appl. No.: 195,945

[22] Filed: Oct. 10, 1980

[30] Foreign Application Priority Data

Nov. 30, 1979 [DE] Fed. Rep. of Germany ....... 2948319

[51] Int. Cl.³ ...................... H01G 7/00; H01R 43/00; H05K 13/00
[52] U.S. Cl. ...................................... 29/854; 29/25.42
[58] Field of Search ...................... 29/25.42, 446, 452, 29/621, 747, 755, 854, 857, 861, 863, 864; 140/71 R

[56] References Cited

U.S. PATENT DOCUMENTS 2,766,510 10/1956 Heibel ................................ 29/25.42
2,953,840 9/1960 Freeburg ............................ 29/25.42
3,079,957 3/1963 Weiss ................................ 29/854 X
3,315,331 4/1967 Weiss ................................ 29/25.42
3,322,995 5/1967 Hansen et al. ..................... 313/325
3,721,003 3/1973 Ueda et al. ............................ 29/854

FOREIGN PATENT DOCUMENTS 1153807 9/1963 Fed. Rep. of Germany .
1162011 1/1964 Fed. Rep. of Germany .
2138083 6/1979 Fed. Rep. of Germany .

Primary Examiner—Ervin M. Combs
Attorney, Agent, or Firm—Hill, Van Santen, Steadman, Chiara & Simpson

[57] ABSTRACT

A method is disclosed for attaching and securing power supply leads to electrical components including ceramic multi-layer capacitors. A tape-shaped transport carrier is continuously provided with power supply leads having a U-shaped portion projecting over the edge of the transport carrier. The U-shaped portion is bent up to form a loop and is then provided with bends. The U-shaped connection part is bent down approximately 90° so that the front bends form an insertion aid for the insertion of the components between the supply leads. A solder operation then follows.

4 Claims, 3 Drawing Figures

METHOD FOR ATTACHING AND SECURING POWER SUPPLY WIRES TO ELECTRICAL COMPONENTS

BACKGROUND OF THE INVENTION

The invention relates to a method for attaching and securing power supply wires which are aligned parallel to one another to lateral surfaces of electrical components which are situated opposite one another. First, a taper- or strip-shaped transport carrier of an automatically functioning assembly system is continuously provided with current supply wires provided as one piece units in a U-shape and intended for a respective component. The two legs of the U-shape and the part connecting them project laterally beyond the edge of the transport carrier. Subsequently, the component is clamped between the legs and is then soldered to them.

Such a method is described in the German AS No. 21 38 083, incorporated herein by reference. However, the electrical component is thereby either inserted between the U-shaped connection wires perpendicular to the plane of said wires or, in case bends which could lead to the crossing of the connection wires are incorporated in the connection wires, the components are indeed inserted in the plane of the U-shape, but, however, in the direction of the displacement of the strip-shaped transport carrier.

During insertion of the components between the U-shaped portion perpendicular to its plane, a very precise adaptation of the path of the wire-shaped power leads for the component can lead to failures in the insertion. Therefore, insertion in the direction parallel to the displacement direction of the transport carrier requires additional steps in the automatically functioning assembly system when opening the crossing parts of the connection wires.

A method for attaching power connections to electrical components is described in German AS No. 11 53 807, incorporated herein by reference, in which the design of the power supplies and their fastening to the strip-shaped carrier strips are undertaken in such manner that the projecting, free ends guarantee a clamping effect. The components are secured between these free ends by means of this clamping effect. The power leads are then electrically conductively and mechanically secured to the components. The power leads intended for components to be built in are designed of one piece, i.e. in a hairpin shape.

This method is only suitable for the attachment and securing of power supply wires to electrical components which are disc-shaped and in which the power supply wires connect at the large lateral surfaces lying opposite one another.

A disc-shaped electrical impedance element with power supply leads and a method for attaching power supply leads to such an element is described in the German AS No. 11 62 011, incorporated herein by reference, in which the power supply leads follow the outline of the disc, approach one another up to a short distance, and then bend away from the disc edge together. An insulating ring is provided approximately at this location through which the wires pass and in which these wires are secured by means of part of a lacquer layer encapsulating the disc on all sides.

In this method, the power supply leads are attached to the narrow sides of a disc-shaped component which lie opposite one another. However, the method required for this type of attaching of power supply leads cannot be implemented with automatically functioning assembly systems in which a strip-shaped transport carrier is employed.

The term "electrical components" is employed within the framework of the present invention for electrical resistors, ceramic ptc resistors, electrical capacitors, particularly multi-layer capacitors with a ceramic dielectric. The term also applies in general for electrical components which have a body which is either itself part of the electrical component (capacitors, resistors, semiconductors) or serves as the carrier plate for other electrical components (for example printed layer circuits), whereby a respective power supply lead is to be secured to these carrier bodies at opposite sides.

In attaching and securing power supply leads to electrical components by means of automatically functioning assembly systems, the individual work steps must be dimensioned to cooperate with one another in such manner that a high clock time of the assembly system is rendered possible. The clock time (the turn "clock time" means the number of movements of the conveying band per minute) of the assembly system depends on the work step which involves the greatest time or, respectively, is difficult to execute. Whereas the shaping of the individual connection leads of a component into a U-shape, the insertion of said U-shape into slots of a transport carrier belt, the further shaping of these connection leads, the later soldering of said leads to the metal surfaces of the electrical component, the testing and the encapsulation with a protective layer are work steps which can be quickly carried out if need be by means of multiple subdivision, the insertion of the electrical component between the power supply leads and the temporary stoppage of said component until the soldering operation presents difficulties which lead to the fact that these work steps determine the overall clock time for the assembly system.

Added thereto is the fact that the electrical components do not always exhibit constant external dimensions, so that the insertion between the power supply leads presents difficulties for the temporary stop, for example, insofar as the required, temporary stop or halt is not guaranteed and an electrically conductive and mechanically stable connection, therefore, does not arise. When the electrical components which are to be provided with power supply leads have different dimensions because of their electrical requirements, then even if it is only a matter of small differences-the system must always be readjusted. This, however, leads to standstill times, particularly given smaller unit numbers.

SUMMARY OF THE INVENTION

An object of the present invention is to specify a method for attaching and securing power supply leads which proceed parallel to one another to lateral surfaces of electrical components which lie opposite one another. This method permits an increase of the clock time possible, in which fluctuations in the dimensions of the electrical components are possible, and which, given a slight change of the dimensions, does not require a potential extensive readjustment of the respective work steps of the assembly system so that, overall, the difficulties described above are eliminated and the power supply leads should proceed with respect to one another at a desired modular dimension, for example 2.5 mm, 5 mm.

In order to achieve this object, with the method of the invention a downwardly projecting connection bow is provided which permits entry of the component between the connection leads, yet supports the connection leads relative to one another prior to soldering of the leads to the component. Also, an insertion aid is provided by bending the leads at the U-shaped portion and also in the proximity of an edge of the carrier so as to retain the leads in parallel alignment with respect to one another and also to provide a tapered transition portion which facilitates insertion of the component between the leads.

A preferred embodiment of the method of the invention provides the following method steps.

(a) The part of the parallel power supply wires are provided with a U-shape which projects laterally over the edge of the transport carrier and is bent up in the work step B following insertion A into the slots of the transport carrier in such manner that the radius of the U-arc is increased and the power supply leads form an opening angle with respect to one another. A loop therefore arises.

(b) In work step C, the loop is provided with two respective bends so that the connection leads again proceed essentially parallel. The bends are situated approximately in the proximity of the edge of the transport carrier, and the bends form the transition to the U-shaped arc.

(c) In method step D, the U-shaped arc is bent down by an angle $\alpha$ of approximately 90° in such manner that the two bends remain in their previous plane and form an insertion aid tapering in the direction of the power supply leads in this manner.

(d) In method step E, the components are inserted between the power supply leads and are soldered to them in a manner known per se.

(e) In workstep F, the connecting U-shaped arc, together with the bends and parts of the power supply leads, are separated in the proximity of the component.

(f) Subsequently, the components with the power supply leads are tested in a manner known per se and, if need be, are encapsulated and finished.

In the invention, thus a tape-shaped transport carrier is employed which is provided with slots proceeding parallel to one another into which a U-shape is provided formed from two power supply leads intended for a respective component. This U-shape exists in its simplest form in the first part of the carrier belt, which is then bent into a loop and is provided with bends in the further path. The connecting part is bent out of the original plane by an angle of approximately 90°, so that an insertion aid for the components exist. The components are soldered to power supply wires shaped in that manner in the further path.

DESCRIPTION OF THE PREFERRED EMBODIMENTS

Figure 1:
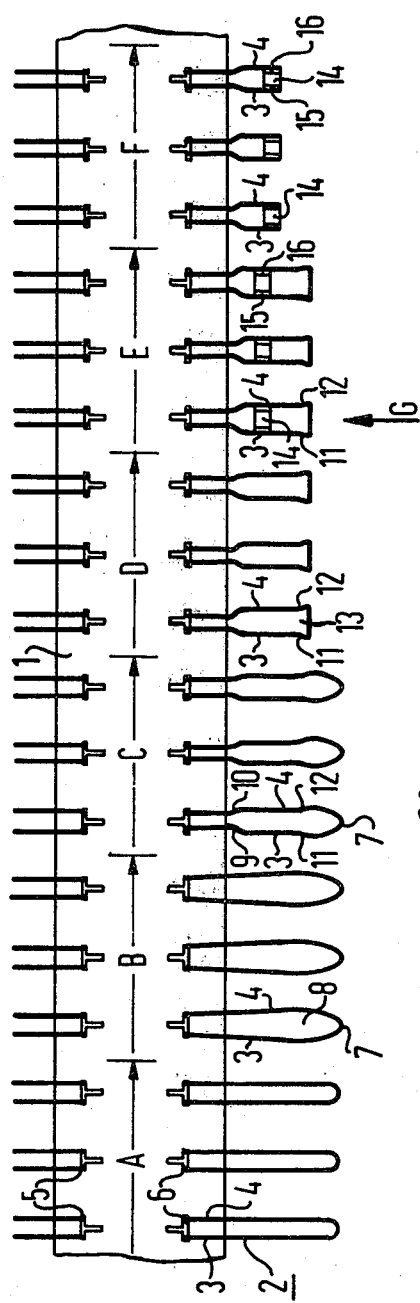
FIG. 1 illustrates the tape-shaped transport carrier in which the individual worksteps are indicated in a considerably abbreviated form since in actual practice, a multitude of identically shaped power supply leads is associated with each workstep, and whereas only three such units are respectively illustrated here.

In FIG. 1, 1 indicates the tape-shaped carrier strip. The power supply leads 3 and 4 intended for an electrical component are inserted in slots 5 and 6 of the carrier strip 1. The part 2 of the parallel power supply leads 3 and 4 designed as a U-shape projects beyond the edge of the transport carrier 1. The insertion of this single-piece U-shape ensues in the automatically functioning system in a manner known per se, namely in such manner that in accordance with the work clock of the assembly system, wire is unrolled from a supply roll which, cut to the necessary length, is inserted into the slots by means of a metal tongue functioning in the plane of the transport carrier 1 and perpendicular to the transport direction.

Such devices are described, for example, in U.S. Pat. Nos. 2,953,840 and 3,315,331, incorporated herein by reference.

In the further course of the worksteps, the part 2 laterally projecting over the edge of the transport carrier 1 is bent into a loop, whereby the radius of the U-shaped arc 7 is increased and the power supply leads 3,4 describe an angle which opens away from the transport band 1.

Subsequently, this loop 8 is provided with bends 9 and 10 in the proximity of the edge of the transport carrier 1. These serve, on the one hand, to limit the lacquer encapsulations of the component along the wires and, on the other hand, permit following the modular dimension. At the same time, bends 11, 12 are generated so that the connection leads 3 and 4 proceed parallel to one another, however, if need be, with a greater distance from one another than in the projecting part 2. The bends 11 and 12 form the transition to the U-shaped arc 7.

Figure 3:
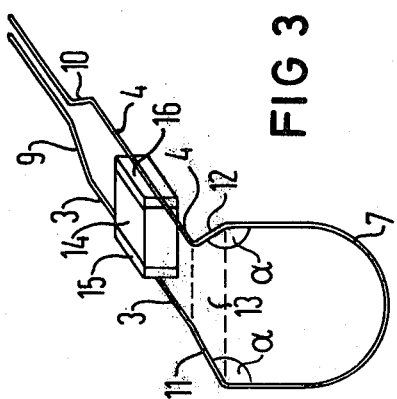
FIG. 3 illustrates a single component with power supply leads in accord with FIG. 1 in workstep E.

The U-shaped arc 7 is then bent down by an angle $\alpha$ of approximately 90° from the plane of the transport carrier and the power supply leads 3,4 inserted in the carrier, so that an insertion aid 13 results which is formed by the bends 11 and 12 (FIG. 3).

The insertion of the component 14 in the direction of the arrow G between the power supply leads 3 and 4 now presents no difficulties because the insertion aid 13 takes fluctuations in the dimensions of the length or thickness of the component into consideration. A resilient support is guaranteed on the one hand since the power supply leads 3 and 4 are in the slots 5 and 6 of the transport carrier and, on the other hand, since the U-shaped arc bent down out of the plane continues to exist, said U-shaped arc causing the power supply leads 3 and 4 to bend towards one another with a certain pre-stress in the area of the bends 11 and 12, said pre-stress arising when the component has been inserted between the power supply leads, as proceeds from FIG. 3.

In the further workstep E, the soldering of the metallic power supply coatings 15 and 16 of the component 14 to the power supply leads 3 and 4 also ensues, mainly preferably by means of wave soldering which is known per se and consists in a stream of solder being conveyed out of a molten solder bath which is conducted past the parts to be soldered to one another and then returned into the solder bath.

In the subsequent workstep F, the connecting U-shaped arc 7, together with the bends 11 and 12 and parts of the power supply leads 3 and 4, are separated in the proximity of the component 14, so that an electrical connection between the power supply coatings 15 and 16 (which serve as solder connections) no longer exists. The electrical components 14 are then tested as to their electrical values in a manner known per se, are encapsulated if needed, and are finished off in other ways, for example are packaged.

Figure 2:
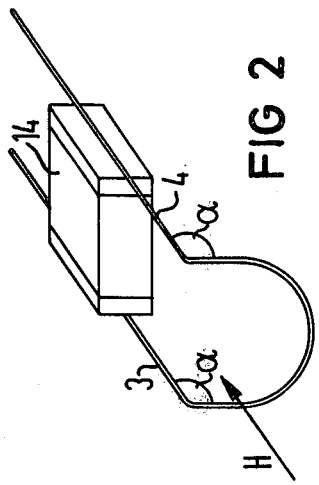
FIG. 2 illustrates a single component with this component inserted between power supply leads which proceed completely parallel.

The embodiment according to FIG. 2 shows that bending of the connection bow between the power supply leads 3, 4 around the angle α is also possible without bends 11, 12 (FIG. 3). In order to insert the component 4, the leads 3 and 4 must then be spread somewhat, for example, with a wedge. Nonetheless, the component 14 can be inserted between the leads 3 and 4 in the direction of arrow H.

The present invention achieves the object upon which it is based in a completely satisfactory manner. In particular, the clock time is increased so that the automatically functioning assembly system can now be operated with a clock velocity of 100 clocks/minute (100 step movements per minute of the conveyor band).

It is self-evident that the individual worksteps, such as insertion of the power supply leads 3, 4 into the slots 5, 6 of the transport carrier 1, the formation of the loop 8, the generation of the bends 9 through 12, the bending of the U-shaped arc 7, the insertion of the components 14, the soldering of the components 14 to the power supply leads 3 and 4, as well as the subsequent worksteps respectively sequence simultaneously, whereas the sequence described above is only carried out during the start-up phase of the assembly system.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A method for attaching and securing power supply leads aligned parallel to one another to opposite lateral surfaces of electrical components, comprising the steps of:
   (a) continuously inserting one-piece U-shaped power supply leads into slots of a band-shaped transport carrier of an automatically functioning assembly system, the power supply leads comprising two parallel legs and a U-shaped portion coplanar with the legs, the U-shaped portion projecting laterally beyond an edge of the transport carrier;
   (b) bending the U-shaped portion downwardly out of the plane of said legs so as to form a connection bow to permit insertion of a component between the two legs in a direction substantially parallel to the two legs and the plane of the transport carrier without influence from the connection bow;
   (c) inserting the components between the power supply leads formed by the two parallel legs in a direction substantially parallel to the two legs and soldering the leads to opposing component surfaces;
   (d) removing the connection bow in a proximity of the component; and
   (e) completing processing of the components.

2. A method according to claim 1 including the following steps:
   (a) following insertion of the U-shaped piece into the slots of the carrier the U-shaped portion is bent to enlargen a radius thereof so that the power supply leads form an opening angle with respect to one another and a loop is formed;
   (b) providing the loop thus formed with two respective bends in each leg so that portions of the legs forming connection leads again are parallel, in each leg one of the bends being approximately situated in a proximity of the edge of the transport carrier and the other bend forming a transition to a U-shaped portion;
   (c) bending the U-shaped portion down by an angle α of approximately 90° in such manner that said other bends remain in their previous plane and form a component insertion aid tapering in a direction of the power supply leads; and
   (d) inserting the components via the insertion aid between the power supply leads in preparation for the soldering and subsequent steps.

3. A method of claim 1 wherein the U-shaped portion is bent down by approximately 90°.

4. A method according to claim 1 wherein the connection bow provides a springy connection between the leads providing a clamping effect to retain the component in position prior to soldering.

* * * * *